United States Patent
Chen

(10) Patent No.: US 9,159,451 B2
(45) Date of Patent: Oct. 13, 2015

(54) TESTING SYSTEM AND TESTING METHOD THEREOF

(75) Inventor: Chien-Chi Chen, Keelung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 513 days.

(21) Appl. No.: 13/535,300

(22) Filed: Jun. 27, 2012

(65) Prior Publication Data
US 2013/0250709 A1   Sep. 26, 2013

(30) Foreign Application Priority Data

Mar. 26, 2012  (TW) .............................. 101110323 A

(51) Int. Cl.
| | | |
|---|---|---|
| G01R 31/00 | (2006.01) | |
| G11C 16/04 | (2006.01) | |
| G11C 29/00 | (2006.01) | |
| G11C 29/56 | (2006.01) | |
| G11C 16/00 | (2006.01) | |

(52) U.S. Cl.
CPC ........ G11C 29/006 (2013.01); G11C 29/56016 (2013.01); *G11C 16/00* (2013.01); *G11C 2029/5602* (2013.01)

(58) Field of Classification Search
USPC ................. 324/754.07; 365/185.03; 711/103; 714/718
See application file for complete search history.

(56) References Cited

U.S. PATENT DOCUMENTS

| | | | |
|---|---|---|---|
| 7,042,243 B2 | 5/2006 | Matsumoto | |
| 7,924,035 B2 | 4/2011 | Huebner | |
| 8,086,919 B2 | 12/2011 | Chen et al. | |
| 8,375,340 B2 | 2/2013 | Watanabe et al. | |
| 2003/0074611 A1* | 4/2003 | Nachumovsky | ............... 714/718 |
| 2007/0145363 A1* | 6/2007 | Fandrich | ........................... 257/48 |
| 2007/0263442 A1* | 11/2007 | Cornwell et al. | ......... 365/185.03 |
| 2009/0327588 A1* | 12/2009 | Sutardja et al. | ................ 711/103 |
| 2010/0013503 A1 | 1/2010 | Huebner | |
| 2010/0241914 A1* | 9/2010 | Chen et al. | ..................... 714/718 |
| 2011/0264973 A1 | 10/2011 | Ma | |

FOREIGN PATENT DOCUMENTS

| | | |
|---|---|---|
| CN | 1574268 | 2/2005 |
| CN | 101840877 | 9/2010 |
| TW | 449849 | 8/2001 |

(Continued)

OTHER PUBLICATIONS

English language translation of abstract of TW 449849 (published Aug. 11, 2001).
English language translation of abstract of TW I286214 (published Sep. 1, 2007).

(Continued)

*Primary Examiner* — Vincent Q Nguyen
(74) *Attorney, Agent, or Firm* — McClure, Qualey & Rodack, LLP

(57) ABSTRACT

A testing system for a wafer having a plurality of flash memory dies is provided. The testing system includes a testing apparatus and a probe card coupled to the testing apparatus via a specific transmission line. The testing apparatus provides a testing requirement. The probe card includes a plurality of probes and a controller. The probes contact with at least one of the flash memory dies of the wafer. The controller writes a testing data to the flash memory die according to the testing requirement and reads the testing data from the flash memory die via the probes. The controller provides a testing result to the testing apparatus according to the read testing data.

11 Claims, 4 Drawing Sheets

(56) References Cited

FOREIGN PATENT DOCUMENTS

| | | |
|---|---|---|
| TW | I286214 | 9/2007 |
| TW | 201001585 | 1/2010 |
| TW | 201007185 | 2/2010 |
| TW | 201035982 | 10/2010 |
| TW | 201140099 | 11/2011 |

OTHER PUBLICATIONS

English language translation of abstract of TW 201001585 (published Jan. 1, 2010).
English language translation of abstract of TW 201007185 (published Feb. 16, 2010).
English language translation of abstract of TW 201140099 (published Nov. 16, 2011).

* cited by examiner

TESTING SYSTEM AND TESTING METHOD THEREOF

CROSS REFERENCE TO RELATED APPLICATIONS

This Application claims priority of Taiwan Patent Application No. 101110323, filed on Mar. 26, 2012, the entirety of which is incorporated by reference herein.

BACKGROUND OF THE INVENTION

1. Field of the Invention

The invention relates to a testing system, and more particularly to a testing system of a flash memory.

2. Description of the Related Art

In recent years, flash memory has been made to have the characteristics of data non-volatility, low power consumption, a compact size, and a non-mechanical structure. Hence, flash memory has been adapted for various electronic devices, especially portable electronic devices.

In general, a flash memory chip of a flash memory storage device comprises one or more flash memory dies according to various storage capacities. Before the flash memory die is packaged in a flash memory chip, a wafer sorting test is performed, so as to test each memory die of the wafer. After completing the wafer sorting test, good memory dies will be packaged into a chip, e. g. multi-chip package (MCP). If the memory dies of the wafer are not entirely tested before a multi-chip is packaged, a chip may be discarded due to some defective memory dies when a package final test is performed for the chip. Thus, damage is made to good memory dies of the chip and package cost is increased.

Furthermore, the testing apparatuses are complex and expensive for wafer sorting tests. Traditionally, when a wafer sorting test is performed, automatic test equipment (ATE) may write a great quantity of testing data into the die of the wafer to be tested, and then read the written data from the die to be tested. Next, the ATE performs an error checking and correcting (ECC) procedure, to determine whether the die to be tested has defects. Because a great quantity of data is needed for an ECC procedure, a higher level ATE is used to test various memory dies simultaneously. If a lower level ATE is used, it is unable to test various memory dies simultaneously, thereby increasing test time and test cost.

Therefore, a testing apparatus and method thereof for decreasing test costs are desired.

BRIEF SUMMARY OF THE INVENTION

Testing systems and a testing method thereof are provided. An embodiment of a testing system for a wafer having a plurality of flash memory dies is provided. The testing system comprises: a testing apparatus, providing a testing requirement; and a probe card coupled to the testing apparatus via a specific transmission line. The probe card comprises: a plurality of probes, contacting with at least one of the flash memory dies of the wafer; and a controller, writing a testing data to the flash memory die according to the testing requirement, and reading the testing data from the flash memory die via the probes. The controller provides a testing result to the testing apparatus according to the read testing data.

Furthermore, another embodiment of a testing system for a wafer having a plurality of flash memory dies is provided. The testing system comprises: a testing apparatus, providing a testing requirement; a Hub coupled to the testing apparatus via a first universal serial bus (USB) transmission line; and a probe card coupled to the Hub via a plurality of second USB transmission lines. The probe card comprises: a plurality of probes, contacting with the flash memory dies of the wafer; and a plurality of controllers, each coupled to the Hub via the corresponding second USB transmission line, wherein each of the controllers is coupled to the corresponding flash memory die via the probes, and each of the controllers writes a testing data to the corresponding flash memory die according to the testing requirement, and reading the testing data from the corresponding flash memory die via the probes. Each of the controllers provides a testing result to the testing apparatus according to the read testing data.

Moreover, an embodiment of a testing method for a wafer having a plurality of flash memory dies is provided. A testing requirement from a testing apparatus is obtained by a controller. A testing data is written to at least one of the flash memory dies according to the testing requirement by the controller via a plurality of probes of a probe card. The testing data is read from the flash memory die of the wafer by the controller via the probes of the probe card. A testing result is provided to the testing apparatus according to the read testing data by the controller. The controller is implemented in the probe card.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
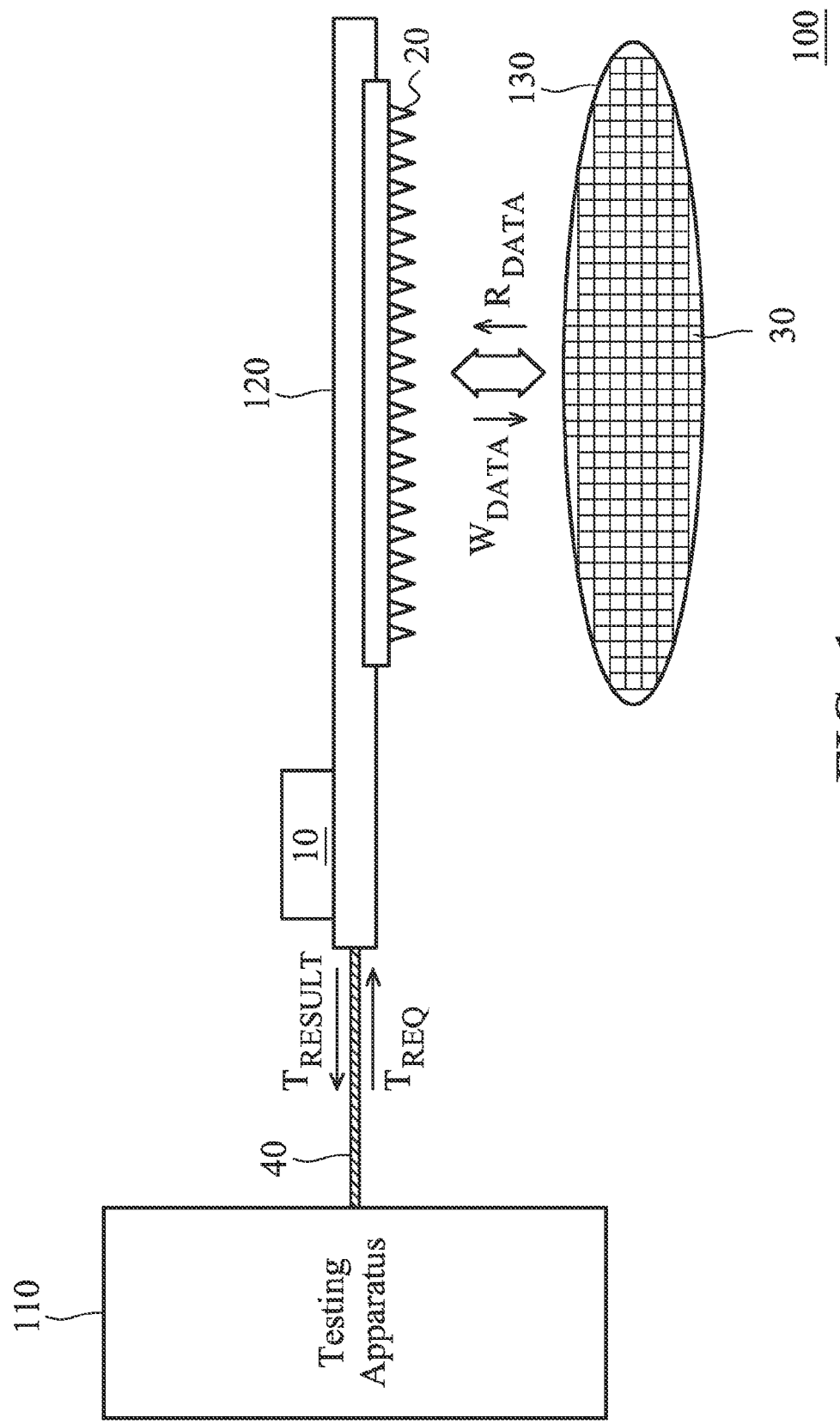
FIG. 1 shows a testing system according to an embodiment of the invention.

FIG. 1 shows a testing system 100 according to an embodiment of the invention. The testing system 100 comprises a testing apparatus 110, a probe card 120 and a wafer 130, wherein the wafer 130 has a plurality of flash memory dies 30 to be tested. The probe card 120 is coupled to the testing apparatus 110 via a transmission line 40. In the embodiment, the transmission line 40 may be a Universal Serial Bus (USB) transmission line or a Universal Asynchronous Receiver/Transmitter (UART) transmission line, e.g. RS232. In addition, the probe card 120 comprises a controller 10 and a plurality of probes 20, wherein the controller 10 is implemented in an integrated circuit (IC). The probe card 120 contacts the pads of at least one of the flash memory dies 30 within the wafer 130 via the probes 20, such that the controller 10 is electrically connected to the flash memory die 30. First, the testing apparatus 110 transmits a testing requirement $T_{REQ}$ to the controller 10 of the probe card 120 via the transmission line 40. According to the testing requirement $T_{REQ}$, the controller 10 writes data $W_{DATA}$ to the flash memory die 30 via the probes 20. Next, the controller 10 reads the data $R_{DATA}$ that was written previously from the flash memory die 30 via the probes 20. After obtaining the data $R_{DATA}$, the controller 10 uses an error checking and correcting (ECC) engine to perform an ECC procedure for the read data $R_{DATA}$, to obtain a testing result $T_{RESULT}$. Next, the controller 10 transmits the testing result $T_{RESULT}$ to the testing apparatus 110 via the transmission line 40. Thus, the testing apparatus 110 determines whether the flash memory die 30 is normal according to the testing result $T_{RESULT}$, and marks the defective flash memory die 30. By using the controller 10 to perform the ECC procedure and to provide the testing results $T_{RESULT}$, the computation of the testing apparatus 110 is decreased obviously, thereby increasing test efficiency. Furthermore, a low level automatic test equipment (ATE) can also be used to test the wafer 130, to reduce test cost. In one embodiment, the testing apparatus 110 may be a computer.

Figure 2A:
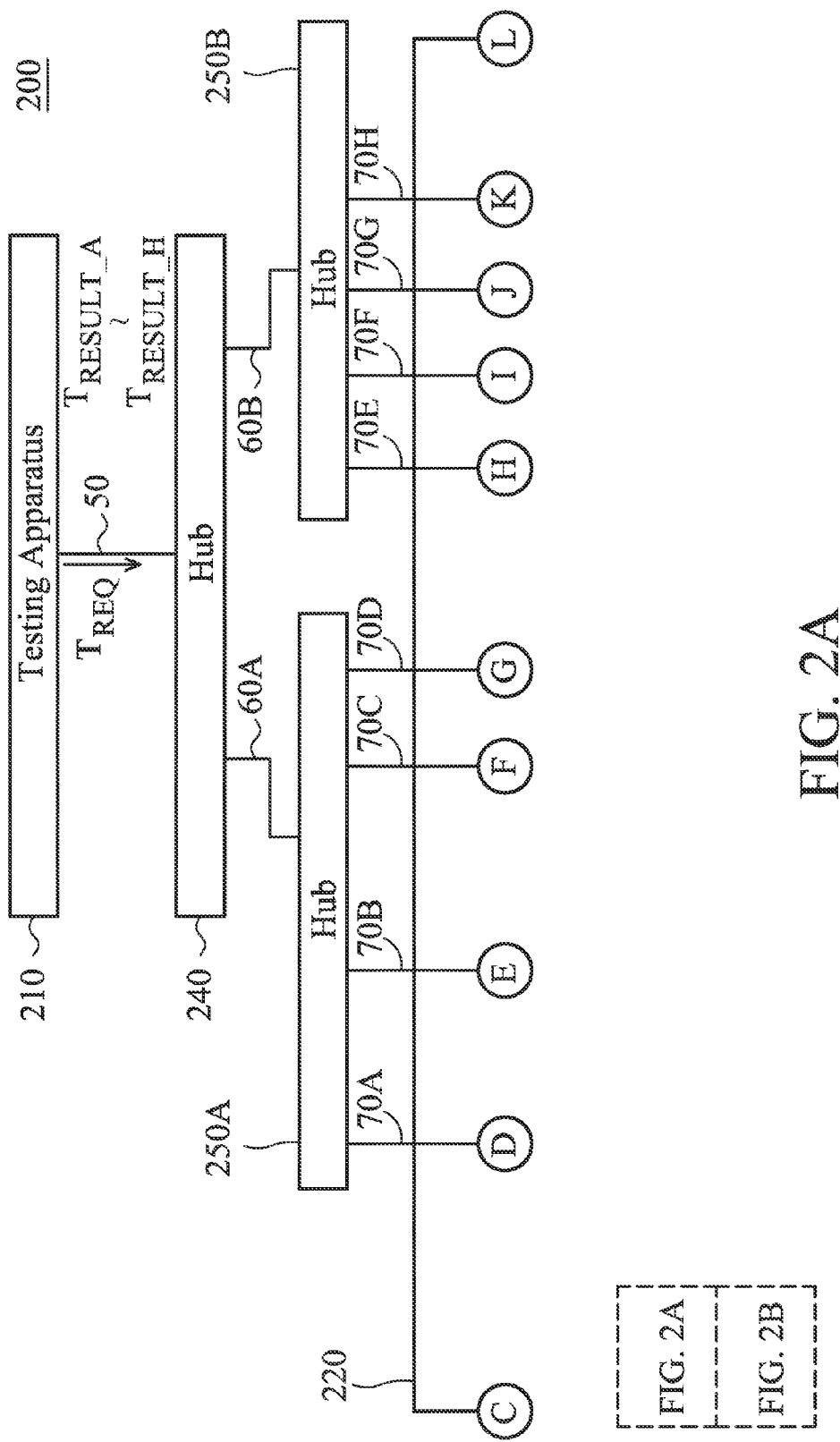
FIGS. 2A and 2B show a testing system according to another embodiment of the invention.
Figure 2B:
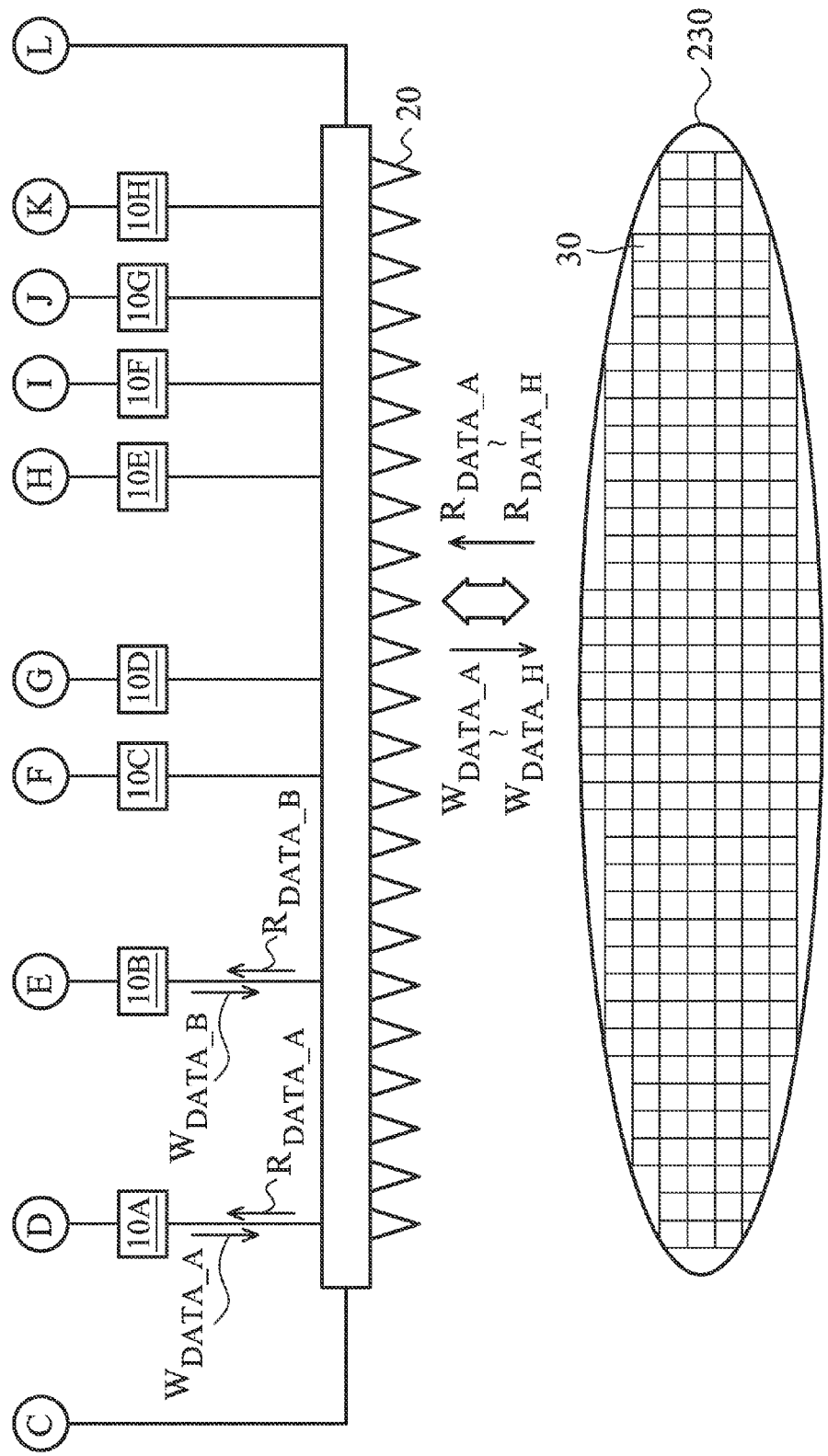

FIGS. 2A and 2B show a testing system 200 according to another embodiment of the invention. The testing system 200 comprises a testing apparatus 210, a probe card 220, a wafer 230 and the Hubs 240, 250A and 250B. The wafer 230 has a plurality of flash memory dies 30 to be tested. The Hub 240 is coupled to the testing apparatus 210 via a transmission line 50. The Hub 240 is also coupled to the Hubs 250A and 250B via the transmission lines 60A and 60B. The probe card 220 comprises a plurality of controllers 10A-10H and a plurality of probes 20, wherein the controllers 10A-10H are implemented in different ICs, respectively. The probe card 220 contacts the pads of various flash memory dies 30 within the wafer 230 via the probes 20, such that the controllers 10A-10H are electrically connected to the corresponding flash memory dies 30, respectively. The controllers 10A-10D are coupled to the Hub 250A via the transmission lines 70A-70D, respectively, and the controllers 10E-10H are coupled to the Hub 250B via the transmission lines 70E-70H, respectively. In the embodiment, the transmission lines 50, 60A-60B and 70A-70H are USB transmission lines. In FIGS. 2A and 2B, the testing apparatus 210 simultaneously transmits a testing requirement TREQ to the controllers 10A-10H of the probe card 220 via the transmission line 50, the Hub 240, the transmission lines 60A-60B, the Hubs 250A-250B and the transmission lines 70A-70H. Next, in response to the testing requirement TREQ, the controllers 10A-10H write the data WDATA_A-WDATA-H to the corresponding flash memory dies 30 via the corresponding probes, respectively. In the embodiment, the data WDATA_A-WDATA-H are the same testing data. In other embodiments, the data WDATA_A-WDATA-H may be different from the testing data. Next, the controllers 10A-10H read the data RDATA_A-RDATA-H that are written previously from the corresponding flash memory dies 30 via the corresponding probes 20, respectively. Next, each controller uses an ECC engine to perform an ECC procedure for the read data, to obtain a testing result. For example, the controller 10A performs an ECC procedure for the read data RDATA_A, to obtain a testing result TRESULT_A, and the controller 10B performs an ECC procedure for the read data RDATA_B, to obtain a testing result TRESULT_B. Next, each controller transmits the testing result to the testing apparatus 210 via the corresponding transmission line and the corresponding Hub. For example, the controller 10H transmits the testing result TRESULT_H to the testing apparatus 210 via the transmission line 70H, the Hub 250B, the transmission line 60B, the Hub 240 and the transmission line 50. Thus, the testing apparatus 210 determines whether the corresponding flash memory dies 30 are normal according to the testing results TRESULT_A-TRESULT_H, and marks the defective flash memory die 30. In the embodiment, the testing apparatus 210 may simultaneously test the flash memory dies 30 of the wafer 230 via the plurality of controllers of the probe card 220, thereby reducing test time. Furthermore, by using the controllers 10A-10H to perform the ECC procedures and to provide the testing results TRESULT-A-TRESULT-H, the computation of the testing apparatus 210 is decreased obviously, thereby increasing test efficiency. Furthermore, a low level ATE can also be used to test the wafer 230, to reduce test cost. In one embodiment, the testing apparatus 210 may be a computer.

Figure 3:
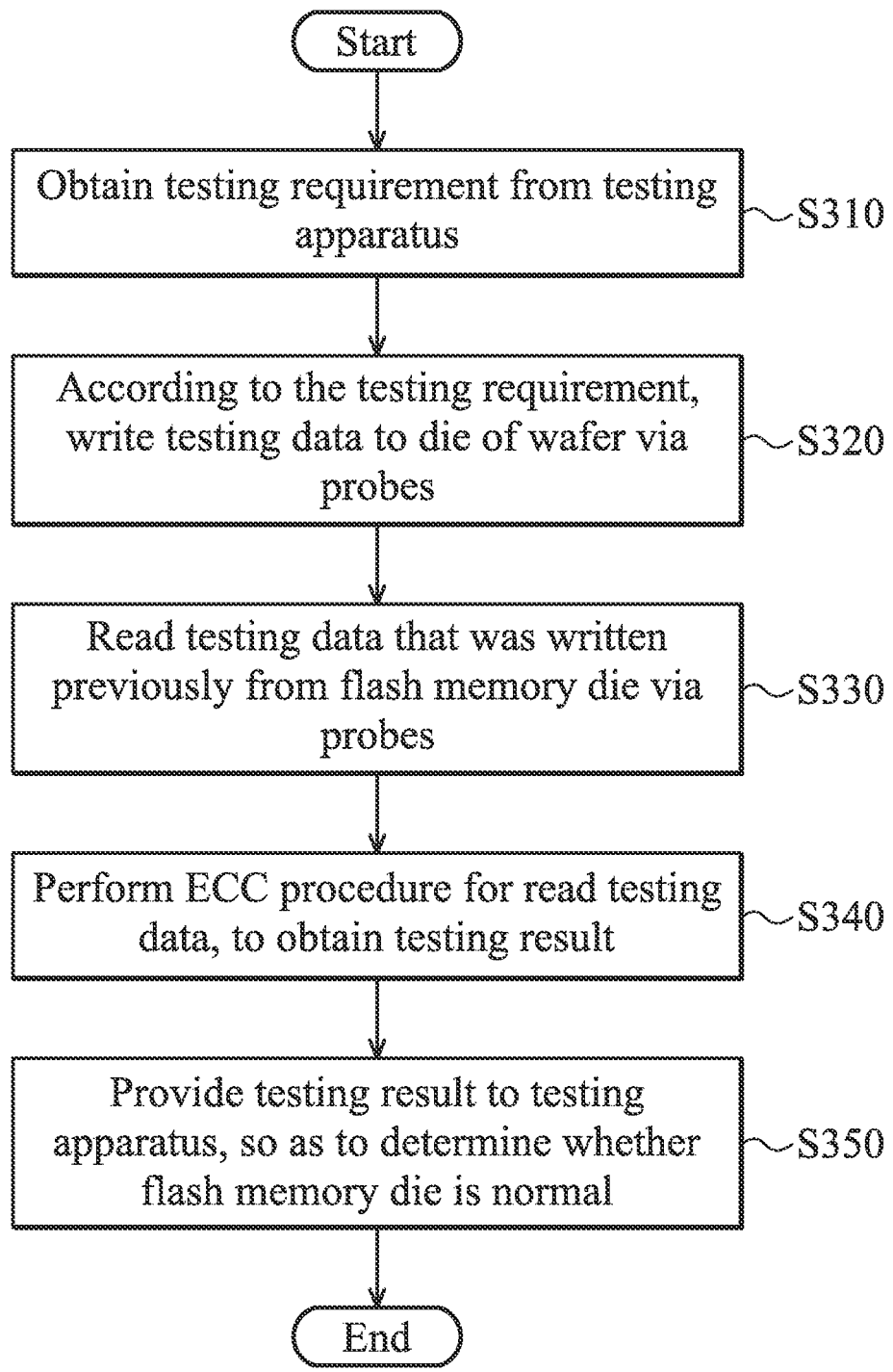
FIG. 3 shows a testing method for a wafer having a plurality of flash memory dies according to an embodiment of the invention.

FIG. 3 shows a testing method for a wafer having a plurality of flash memory dies according to an embodiment of the invention. First, a controller that is disposed in a probe card obtains a testing requirement from a testing apparatus (step S310). Next, according to the testing requirement, the controller writes a testing data to at least one of the dies of the wafer via the probes of the probe card (step S320). Next, in step S330, the controller reads the testing data that was written previously from the flash memory die via the probes of the probe card. Next, the controller performs an ECC procedure for the read testing data, to obtain a testing result (step S340). Next, the controller provides the testing result to the testing apparatus, such that the testing apparatus determines whether the flash memory die is normal according to the testing result (step S350).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A testing system for a wafer having a plurality of flash memory dies, comprising:
a testing apparatus, providing a testing requirement; and
a probe card coupled to the testing apparatus via a specific transmission line, comprising:
a plurality of probes, contacting with at least one of the flash memory dies of the wafer; and
a controller, writing a testing data to the flash memory die according to the testing requirement, and reading the testing data from the flash memory die via the probes, wherein the controller provides a testing result to the testing apparatus according to the read testing data,
wherein the controller performs an error checking and correcting procedure for the read testing data, to obtain the testing result.

2. The testing system as claimed in claim 1, wherein the testing apparatus determines whether the flash memory die is normal according to the testing result.

3. The testing system as claimed in claim 1, wherein the specific transmission line is a universal serial bus (USB) transmission line.

4. The testing system as claimed in claim 1, wherein the specific transmission line is a universal asynchronous receiver/transmitter (UART) transmission line.

5. The testing system as claimed in claim 1, wherein the controller is implemented in an integrated circuit (IC).

6. The testing system as claimed in claim 5, wherein the testing apparatus is a computer.

7. A testing system for a wafer having a plurality of flash memory dies, comprising:
a testing apparatus, providing a testing requirement; a Hub coupled to the testing apparatus via a first universal serial bus (USB) transmission line; and a probe card coupled to the Hub via a plurality of second USB transmission lines, comprising:

a plurality of probes, contacting with the flash memory dies of the wafer; and a plurality of controllers, each coupled to the Hub via the corresponding second USB transmission line, wherein each of the controllers is coupled to the corresponding flash memory die via the probes, and each of the controllers writes a testing data to the corresponding flash memory die according to the testing requirement, and reading the testing data from the corresponding flash memory die via the probes, wherein each of the controllers provides a testing result to the testing apparatus according to the read testing data.

8. The testing system as claimed in claim 7, wherein each of the controllers performs an error checking and correcting procedure for the read testing data, to obtain the testing result.

9. The testing system as claimed in claim 8, wherein the testing apparatus determines whether the corresponding flash memory die is normal according to the testing result provided by each of the controllers.

10. The testing system as claimed in claim 7, wherein each of the controllers is implemented in an integrated circuit (IC).

11. The testing system as claimed in claim 7, wherein the testing apparatus is a computer.

* * * * *